United States Patent
Parkhurst et al.

(10) Patent No.: US 11,658,626 B2
(45) Date of Patent: May 23, 2023

(54) SPLIT MILLER COMPENSATION IN TWO-STAGE DIFFERENTIAL AMPLIFIERS

(71) Applicant: Texas Instruments Incorporated, Dallas, TX (US)

(72) Inventors: Charles Parkhurst, Murphy, TX (US); Gabriel Eugenio De La Cruz Hernandez, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/350,817

(22) Filed: Jun. 17, 2021

(65) Prior Publication Data
US 2022/0407480 A1    Dec. 22, 2022

(51) Int. Cl.
*H03F 3/45* (2006.01)
*H03F 1/34* (2006.01)

(52) U.S. Cl.
CPC ... *H03F 3/45269* (2013.01); *H03F 2200/261* (2013.01)

(58) Field of Classification Search
CPC ... H03F 3/45269; H03F 2200/261; H03F 3/68
USPC ............... 330/360, 310, 295, 124 R, 260
See application file for complete search history.

(56) References Cited

U.S. PATENT DOCUMENTS

| | | | |
|---|---|---|---|
| 8,536,939 B2* | 9/2013 | Shibata | H03F 3/45183 330/310 |
| 9,571,051 B2 | 2/2017 | Parkhurst et al. | |
| 2003/0169104 A1 | 9/2003 | Huckins et al. | |
| 2013/0214863 A1* | 8/2013 | Vidojkovic | H04B 1/30 330/260 |

OTHER PUBLICATIONS

Assi et al., "An Offset Compensated and High-Gain CMOS Current-Feedback Op-Amp," Trans. on Circ. and Sys., vol. 45, No. 1 (IEEE, 1998), pp. 85-90.
Tan et al., "A Two-stage Amplifier with Active Miller Compensation," 2011 Int'l. Conf. on Anti-Counterfeiting, Security and Identification (IEEE, 2011), pp. 201-204.
(Continued)

*Primary Examiner* — Hieu P Nguyen
(74) *Attorney, Agent, or Firm* — Valerie M. Davis; Frank D. Cimino

(57) ABSTRACT

A two-stage differential amplifier with cross-coupled compensation capacitors. The differential amplifier includes first amplifier circuitry receiving a differential input voltage and presenting first and second intermediate outputs. The amplifier further includes a second amplifier stage with a first leg having an input coupled to the second intermediate output of the first amplifier circuitry, and a second leg having an input coupled to the first intermediate output of the first amplifier circuitry. A compensation capacitor is provided for each leg of the second amplifier stage, each coupled between the output of that amplifier leg and its input. A first cross-coupled capacitor is coupled between the output of the first amplifier leg to the input of the second amplifier leg, and a second cross-coupled capacitor is coupled between the output of the second amplifier leg and the input of the first amplifier leg.

18 Claims, 13 Drawing Sheets

(56) References Cited

OTHER PUBLICATIONS

A Low-Power Wideband Reconfigurable Integrated Active-RC Filter with 73 dB SFDR, IEEE Journal of Solid-State Circuits, vol. 41, No. 9, Sep. 1, 2006, pp. 1997-2008, XP055961080, USA.
A High Open Loop Gain Common Mode Feedback Technique for Fully Differential Amplifiers, 2014 IEEE 12th International New Circuits and Systems Conference (NEWCAS), IEEE, Jun. 22, 2014, pp. 261-264, XP032668064.
International Search Report in corresponding PCT Application No. PCT/US2022/033195, dated Sep. 27, 2022 (6 pages).

* cited by examiner

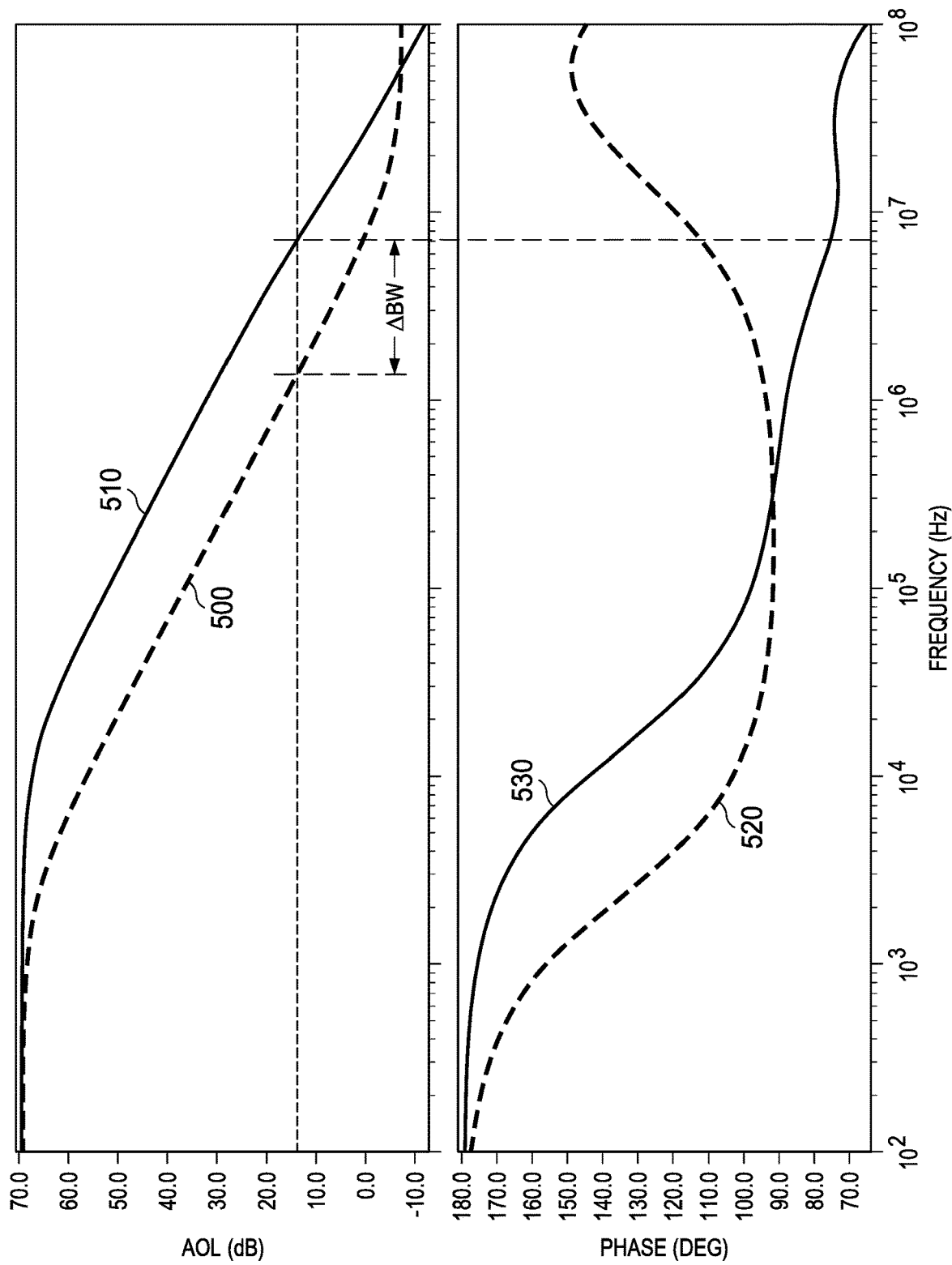

ns. The amplifier further includes a second amplifier stage with a first leg having an input coupled to the second intermediate output of the first amplifier circuitry, and a second leg having an input coupled to the first intermediate output of the first amplifier circuitry. A compensation capacitor is provided for each leg of the second amplifier stage, each coupled between the output of that amplifier leg and its input. A first cross-coupled capacitor is coupled between the output of the first amplifier leg in the second amplifier stage to the input of the second amplifier leg in the second amplifier stage, which is at the first intermediate output, and a second cross-coupled capacitor is coupled between the output of the second amplifier leg in the second amplifier stage and the input of the first amplifier leg in the second amplifier stage, which is at the second intermediate output.

According to another aspect, the differential amplifier may be constructed as a fully differential amplifier.

According to another aspect, the differential amplifier may be constructed as an instrumentation amplifier.

A technical advantage enabled by one or more of these aspects include an improvement in the differential mode gain-bandwidth product, without adversely affecting common mode stability.

Other technical advantages enabled by the disclosed aspects will be apparent to those of ordinary skill in the art having reference to the following specification together with its drawings.

SPLIT MILLER COMPENSATION IN TWO-STAGE DIFFERENTIAL AMPLIFIERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This relates to amplifier circuits, and is more specifically directed to multiple stage differential amplifiers.

Differential amplifiers are common circuit elements in many electronic circuits and systems, including many analog and mixed-signal integrated circuits. As fundamental in the art, a differential amplifier amplifies a differential voltage across a pair of its inputs while suppressing the voltage common to both inputs (i.e., the "common mode" voltage). Differential amplifiers can be implemented as operational amplifiers and other amplifier arrangements relying on negative feedback, as a constant current source, as a current mirror with active load, and in interface applications such as communications and instrumentation, among many other applications. In some of these applications, differential amplifiers are implemented with two or more amplifier stages.

One type of two-stage differential amplifier is known as an instrumentation amplifier (INA). Typically, an INA receives a differential signal and is implemented either as a voltage feedback amplifier (VFA) or a current feedback amplifier (CFA), in either case fed by a differential signal. In response to a differential signal across its two inputs, the INA produces an output differential signal at its two outputs in the form of a positive phase signal and a negative phase signal. A conventional INA may include two amplifiers, two feedback resistors, and a gain resistor, with each amplifier typically including at least two field effect transistors (FET), such as p-channel metal-oxide-semiconductor field-effect (PMOS) transistors, and a compensation capacitor. INAs are widely utilized to condition signals driving comparators or analog-to-digital converters (ADCs). In such an ADC implementation, the gain of the INA may be adjustable to match its output signal with the input dynamic range of the ADC, and thus maximize the number of bits utilized by the ADC in its sampling.

Another type of two-stage differential amplifier is the fully differential amplifier (FDA). FDAs operate to amplify a differential input signal to provide a differential output signal. Two-stage FDAs are often used to provide a maximum voltage swing at its differential output, ideally approaching the power supply voltage, and as such are useful in applications operating at low power supply voltages. Conventional two-stage FDAs use a first amplifier stage to apply a high gain to the differential input signal, followed by a second amplifier stage to drive the amplified differential signal to the desired voltage swing.

It is within this context that the embodiments described herein arise.

BRIEF SUMMARY OF THE INVENTION

According to one aspect, a differential amplifier is constructed with first amplifier circuitry receiving a differential input voltage and presenting first and second intermediate

BRIEF DESCRIPTION OF THE SEVERAL VIEWS OF THE DRAWING

FIG. 5A, FIG. 5B, and FIG. 5C are plots illustrating the performance of an FDA according to the example embodiment of FIG. 3A in comparison with the performance of a conventional FDA.

The same reference numbers are used in the drawings to illustrate the same or similar (in function and/or structure) features.

DETAILED DESCRIPTION OF THE INVENTION

The one or more embodiments described in this specification are implemented into two-stage differential amplifiers such as instrumentation amplifiers (INAs) and fully differential amplifiers (FDAs) as it is contemplated that such implementation is particularly advantageous in that context. However, it is also contemplated that aspects of these embodiments may be applied to differential amplifiers of more than two stages, and applied in other applications that can similarly benefit from those aspects. Accordingly, it is to be understood that the following description is provided by way of example only and is not intended to limit the true scope of this invention as claimed.

Figure 1A:
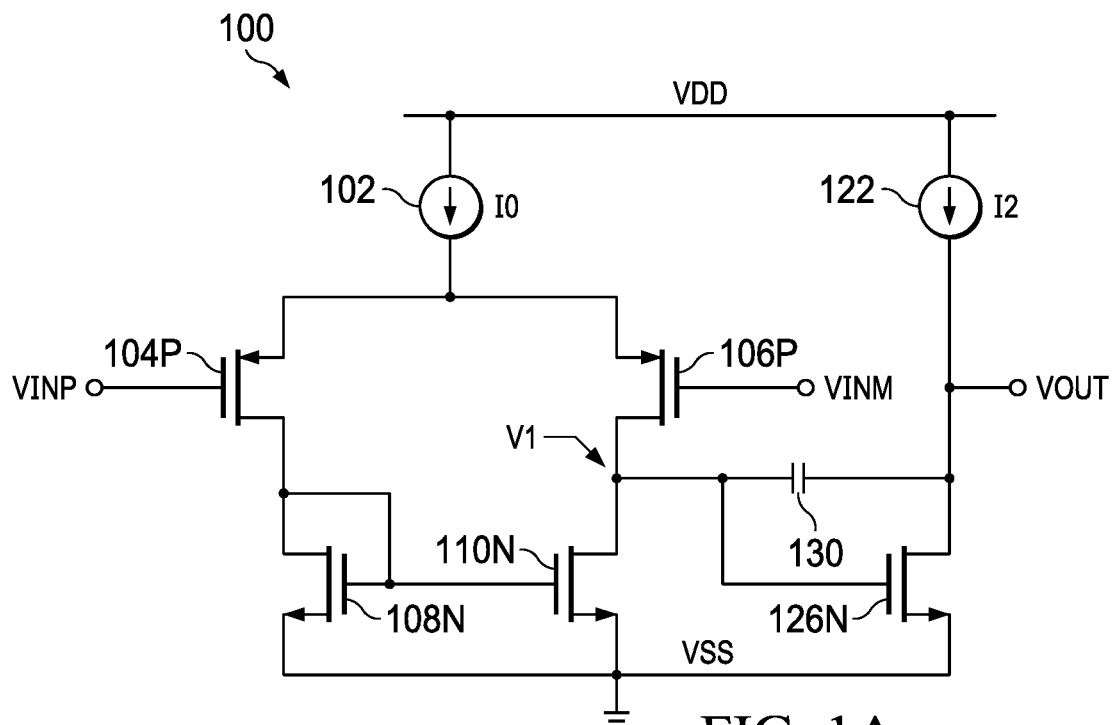
FIG. 1A and FIG. 1B are electrical diagrams, in schematic and block form, respectively, of a conventional instrumentation amplifier (INA).

FIG. 1A illustrates the construction of conventional two-stage differential amplifier 100 as may be used in a conventional instrumentation amplifier (INA). In the first stage of amplifier 100, current source 102 provides a bias current I0 from the VDD power supply voltage to ground (VSS) through two parallel legs, one of which includes p-channel metal-oxide-semiconductor field-effect (PMOS) transistor 104P with its source/drain path connected in series with that of n-channel metal-oxide-semiconductor field-effect (NMOS) transistor 108N, and the other of which includes PMOS transistor 106P and NMOS transistor 110N with their source/drain paths connected in series. The gate of PMOS transistor 104P in one leg receives differential input VINP and the gate of PMOS transistor 106P in the other leg receives differential input VINM. In this example, inputs VINP, VINM can also be referred to as the non-inverting and inverting inputs, respectively, of amplifier 100. The gates of NMOS transistors 108N and 110N are connected together and to the common drain node of transistors 104P and 108N in current mirror fashion. This first stage of amplifier 100 operates to produce a voltage at the common drain node of transistors 106P and 110N (i.e., at intermediate output node V1 in FIG. 1A) that is amplified and inverted from the differential voltage across inputs VINP and VINM. This voltage at intermediate output node V1 is applied to the gate of NMOS transistor 126N in the second stage of differential amplifier 100. In this second stage, current source 122 provides a bias current I2 from the VDD to VSS through the source/drain path of transistor 126N. The output of amplifier appearing at the drain of transistor 126N (i.e., node VOUT) constitutes the output voltage of two-stage amplifier 100.

Figure 1B:
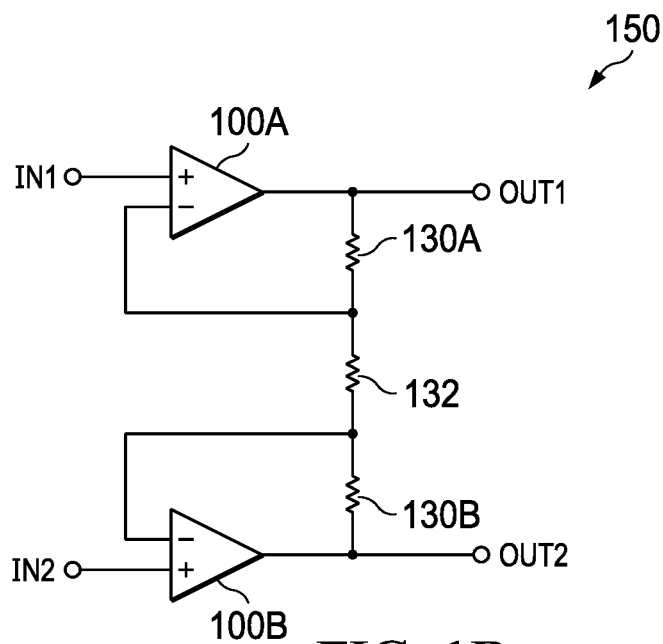

FIG. 1B illustrates a conventional instrumentation amplifier (INA) 150 based on an arrangement of two two-stage differential amplifiers 100A, 100B, each constructed as shown in FIG. 1A. In this conventional arrangement, amplifier 100A receives input IN1 at its non-inverting input (VINP of FIG. 1A) and receives feedback from its output OUT1 via resistor 130A at its inverting input (VINM of FIG. 1B). Similarly, amplifier 100B receives input IN2 at its non-inverting input (VINP of FIG. 1A) and receives feedback from its output OUT1 via resistor 130A at its inverting input (VINM of FIG. 1B). Feedback resistors 130A, 130B are coupled to one another by resistor 132 in series between outputs OUT1, OUT2. In an ADC application, the differential voltage across outputs OUT1, OUT2 becomes the input voltage to the ADC.

According to the well-known Miller effect, parasitic capacitance between the input and output of an amplifier is effectively increased by the gain of the amplifier, increasing the input capacitance of the amplifier accordingly. Because of the Miller effect, the frequency response of an uncompensated two-stage amplifier generally has two poles below the unity gain frequency, which can result in significant instability. To address this instability, conventional amplifiers, including differential amplifiers, commonly include an additional capacitor coupled between the output and input of the amplifier to compensate for the Miller capacitance.

Referring back to FIG. 1A, amplifier 100 includes such a compensation capacitor 130 connected between output VOUT and intermediate output node V1. This compensation capacitor 130 has the effect of moving a low frequency pole of the amplifier response to a lower frequency, and the next higher frequency pole to a higher frequency. Such "pole splitting" can improve the stability and step response of the amplifier.

Further detail in the construction of one type of instrumentation amplifier (INA) is provided in U.S. Pat. No. 9,571,051 issued Feb. 14, 2017, entitled "Reducing Common Mode Transconductance in Instrumentation Amplifiers," commonly assigned herewith and fully incorporated herein by this reference.

However, as the gain of an INA increases, the bandwidth of the INA decreases, resulting in decreased performance at higher gain. This limitation is commonly expressed as the gain bandwidth product of the amplifier, and is a first order limitation of any voltage feedback amplifier such as INA 150. While one could de-compensate the amplifier as gain is increased to increase the bandwidth accordingly, this de-compensation creates another stability problem in connection with common mode voltage. Referring to FIG. 1B, the shared resistors 130A, 130B, 132 in the feedback network of INA 150 results in INA 150 having a unity gain to common mode voltages, regardless of its differential mode gain and decompensation. This unity gain to common mode signals picked up by both of amplifiers 100A, 100B can trigger oscillation of INA 150. Stated another way, the de-compensation of INA 150 with increased gain may reduce the phase margin of INA 150, rendering it potentially unstable. This shift in phase margin and potential instability for common mode signals limits the maximum gain bandwidth product (GBP) available to INA 150.

Figure 2:
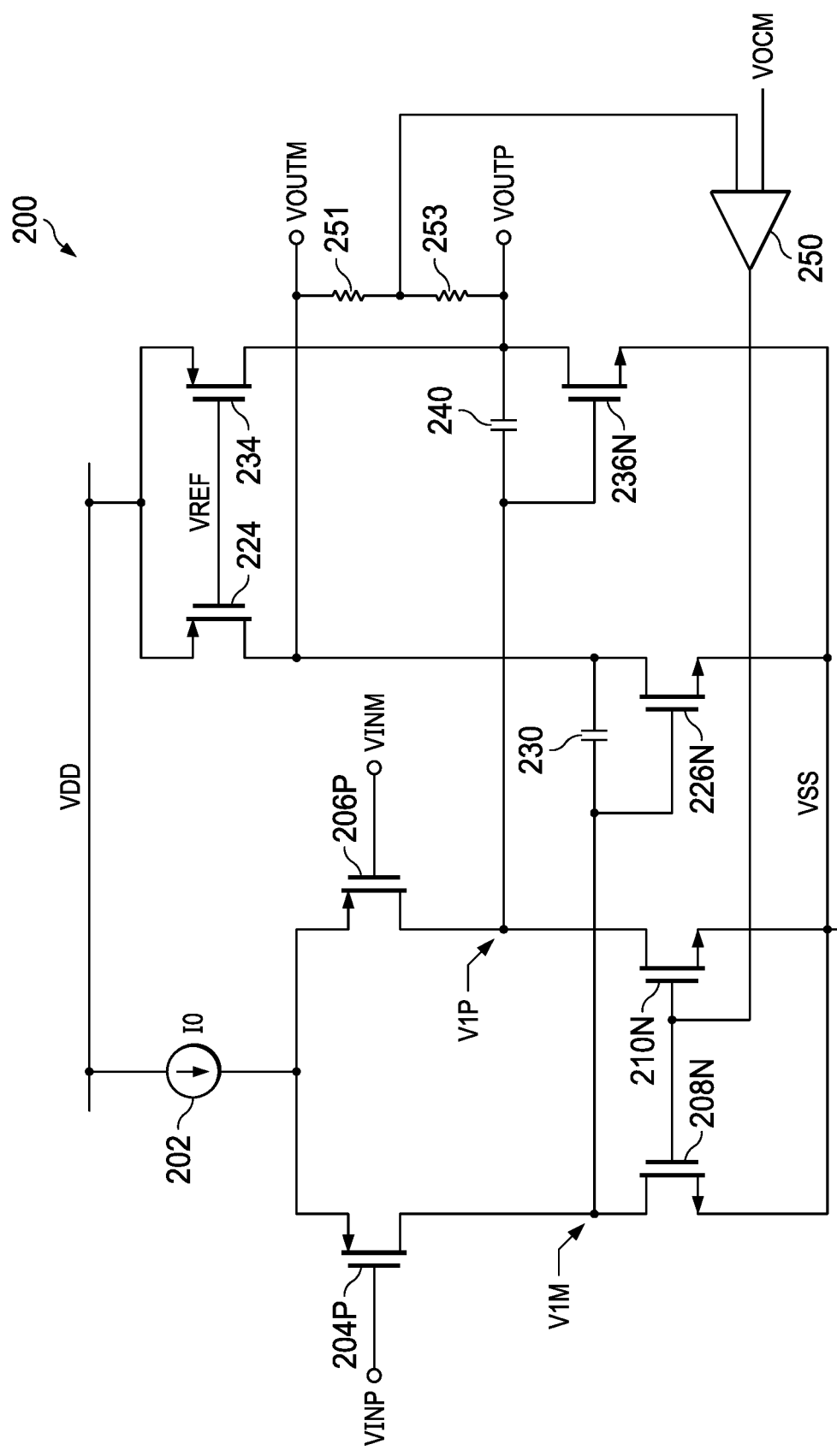
FIG. 2 is an electrical diagram, in schematic form, of a conventional fully differential amplifier (FDA).

FIG. 2 illustrates the construction of conventional two-stage fully differential amplifier (FDA) 200 with conventional Miller compensation. The first stage of amplifier 200 is constructed similarly as that of amplifiers 100 in INA 150, in that current source 202 provides bias current I0 from VDD to the source nodes of parallel PMOS transistors 204P, 206P, which have their drains connected to the source/drain paths of NMOS transistors 208N, 210N, respectively. The gate of PMOS transistor 204P receives non-inverting differential input VINP and the gate of PMOS transistor 206P receives inverting differential input VINM. The gates of NMOS transistors 208N and 210N are connected together and to an output of common mode error amplifier 250. As in amplifier 100, the voltage at the common drain node of transistors 206P and 210N (at intermediate output node V1P) is an amplified, inverted, voltage corresponding to the differential voltage across inputs VINP and VINM. Because amplifier 200 is an FDA, the voltage at the common drain node of transistors 204P and 208N (at intermediate output node V1M) is an amplified, non-inverted, voltage corresponding to the input differential voltage across inputs VINP and VINM. The second stage of amplifier 200 has two parallel legs, one each coupled to receive the two intermediate outputs V1P, V1M of the first stage. In this example, intermediate output node V1P is connected to the gate of NMOS transistor 236N, which has its source at VSS and its drain connected to the gate of PMOS bias transistor 234, the source of which is at VDD. Similarly, intermediate output node V1M is connected to the gate of NMOS transistor 226N, which has its source at VSS and its drain connected to the gate of PMOS bias transistor 224, the source of which is at VDD. The gates of bias transistors 224, 234 are at a reference voltage VREF that sets the desired current through the second stage of amplifier 200. The differential output of amplifier 200 is established across output VOUTP at the common drain node of transistors 234 and 236N, and output VOUTM at the common drain node of transistors 224 and 226N.

Common mode error amplifier 250 receives at one input a common mode voltage from a node between resistors 251, 253, which are connected in series between differential outputs VOUTP, VOUTM. A second input of common mode error amplifier 250 receives an external common mode control signal VOCM. As such, the output of common mode error amplifier 250 controls the gate voltages of transistors 208N, 210N according to the difference between the common mode voltage at the output of FDA 200 and the desired level of control signal VOCM, and thus operates to set the common mode voltage of outputs VOUTP, VOUTM at the desired level.

Each of the legs of the split second stage of FDA 200 has its own Miller compensation capacitor in this conventional arrangement of FIG. 2. Compensation capacitor 230 is connected between output VOUTM and node V1M, and compensation capacitor 240 is connected between output VOUTP and node V1P. Compensation capacitors 230, 240 play a similar role here as capacitor 130 in amplifier 100, implementing "pole splitting" to improve the stability and step response of the amplifier.

However, amplifier 200 in the form of an FDA as shown in FIG. 2 exhibits a common mode unity gain in its feedback loop. The instability due to this common mode feedback could be lessened by reducing the Miller compensation (i.e., decompensating) as amplifier gain increases. However, as in the case of amplifier 100, a limit is present in the amount of decompensation available to amplifier 200 as a result of the common mode feedback, such that decompensation tends to decrease the common mode phase margin.

According to one or more embodiments, the implementation of Miller compensation is modified in two-stage amplifiers such as INAs and FDAs in such a way that the differential gain bandwidth product of the amplifier can be increased without degrading common mode stability. More specifically, the one or more embodiments operate to reduce differential mode compensation while maintaining the same effective compensation for common mode. This enables the amplifier to operate at higher differential gain without affecting stability, thus increasing the gain bandwidth product (GBP) of the amplifier.

Figure 3A:
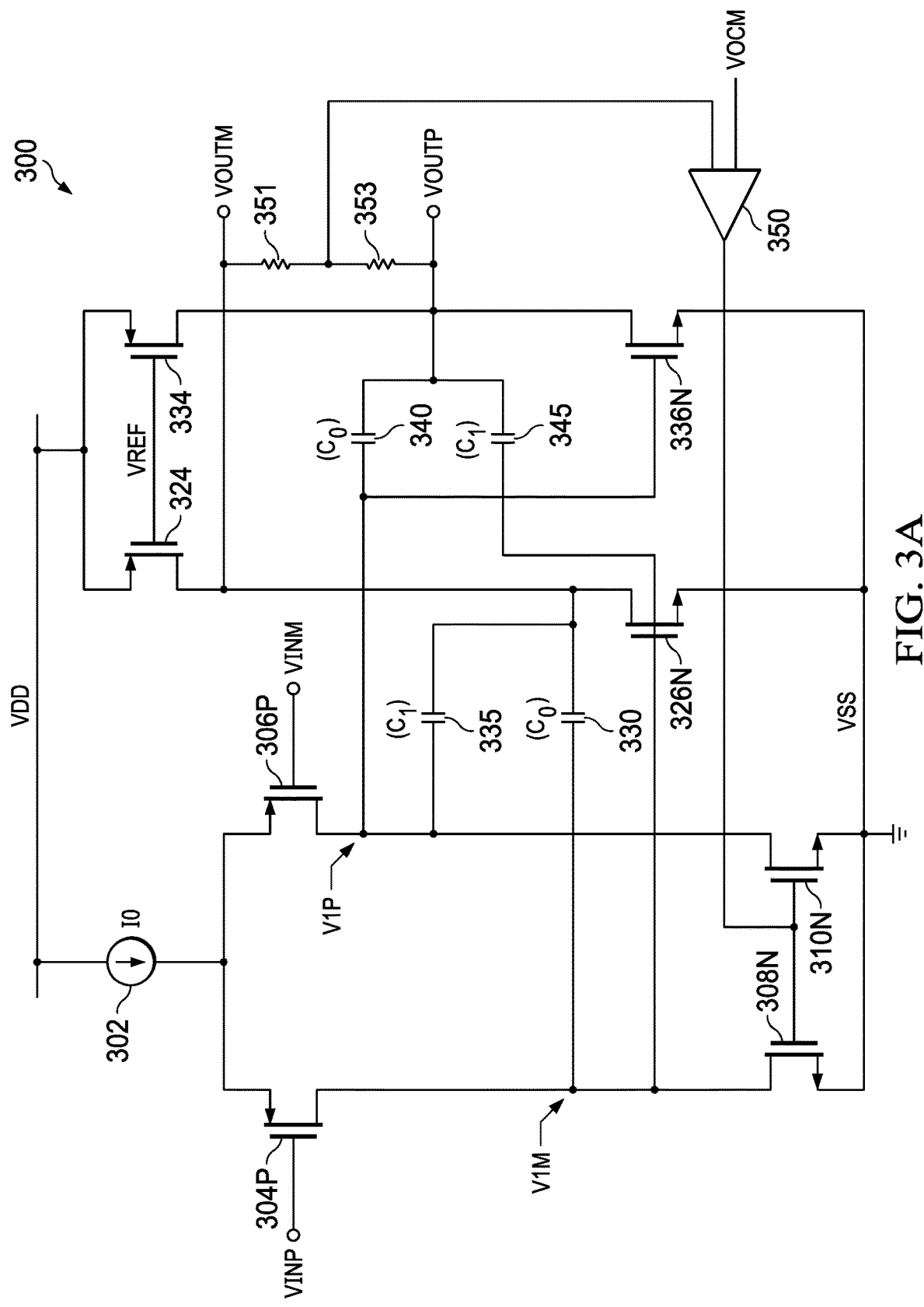
FIG. 3A is an electrical diagram, in schematic form, of an FDA according to an example embodiment.

FIG. 3A illustrates the construction of a two-stage fully differential amplifier (FDA) 300 with Miller compensation according to an example embodiment. The first stage of amplifier 300 is constructed similarly as that of FDA 200 of FIG. 2, with current source 302 providing a bias current 10 from the VDD power supply through two parallel legs. One of the legs in this first stage includes PMOS transistor 304P and NMOS transistor 308N with source/drain paths connected in series between current source 302 and ground VSS, and the other leg includes PMOS transistor 306P and NMOS transistor 310N with their source/drain paths connected in series between current source 302 and common potential VSS (e.g., ground). The gates of PMOS transistors 304P and 306P receive non-inverting differential input VINP and inverting differential input VINM, respectively. The gates of NMOS transistors 308N and 310N are connected together and to an output of common mode error amplifier 350 so that the two legs in this first stage conduct equal currents. This first stage of FDA 300 presents a differential output across node V1P at the common drain node of transistors 304P, 308N, and node V1M at the common drain node of transistors 306P, 310N. This differential voltage across nodes V1P, V1M is amplified and inverted relative to the input differential voltage across inputs VINP and VINM.

As described above relative to FDA 200 of FIG. 2, the second stage of amplifier 300 includes two amplifier legs, one having an input coupled to node V1P and the other having an input coupled to node V1M. In this example, node V1P is connected to the gate of NMOS transistor 326N, which has its source/drain path connected in series with the source/drain path of PMOS bias transistor 324 between VDD and ground VSS. Similarly, node V1M is connected to the gate of NMOS transistor 336N, which has its source/drain path connected in series with the source/drain path of PMOS bias transistor 334 between VDD and ground VSS. The gates of bias transistors 324, 334 are at a reference voltage VREF, e.g., as generated by a voltage reference circuit (not shown), to set the desired current through the second stage of FDA 300. The differential output of FDA 300 is established across output VOUTP at the common drain node of transistors 334 and 336N, and output VOUTM at the common drain node of transistors 324 and 326N.

As in FDA 200 of FIG. 2, common mode error amplifier 350 receives a common mode voltage at one input from a node between resistors 351, 353 connected in series between differential outputs VOUTP, VOUTM, and receives an external common mode control signal VOCM at its other input. Common mode error amplifier 350 biases the gate voltages of transistors 308N, 310N in the first stage of FDA 300 to control the common mode output voltage.

According to this example embodiment, Miller compensation in each of the two legs of the second stage of FDA 300 is "split" in the sense that compensation capacitance is implemented as parallel capacitors. As shown in FIG. 3A, compensation capacitor 330 is connected between amplifier output VOUTM of one second stage leg (the leg including NMOS transistor 336N) and first stage output node V1M connected to the input of that same leg. Similarly, compensation capacitor 340 is connected between amplifier output VOUTP of the other second stage leg (the leg including NMOS transistor 326N) and first stage output node V1P connected to the input of that same leg. Compensation capacitors 330, 340 thus serve a similar role as the compensation capacitors 230, 240 in conventional FDA 200 of FIG. 2. According to this example embodiment, however, cross-coupled compensation capacitor 335 is connected between amplifier output VOUTM of one second stage leg (the NMOS 326N leg) and first stage output node V1P at the input of the opposite second stage leg (the NMOS 336N leg). Similarly, cross-coupled compensation capacitor 345 is connected between amplifier output VOUTP of the other second stage leg (the NMOS 336N leg) and first stage output mode V1M at the input of the opposite second stage leg (the NMOS 326N leg). Capacitors 335, 345 are thus cross-coupled in the sense that each couples an output of one leg in the second stage of FDA 300 to the input of the opposite leg in the second stage of FDA 300. Conversely, compensation capacitors 330, 340 each couple an output of a leg in the second stage of FDA 300 to the input of that same second stage leg. In this example, compensation capacitors 330 and 340 have a nominal capacitance $C_0$ and cross-coupled compensation capacitors 335 and 345 each have a nominal capacitance $C_1$ that is smaller than capacitance $C_0$. As will now be described, the presence of cross-coupled compensation capacitors 335 and 345 in FDA 300 according to this implementation provides differential mode decompensation at higher differential mode gain, while maintaining common mode compensation and thus common mode stability.

Figure 4:
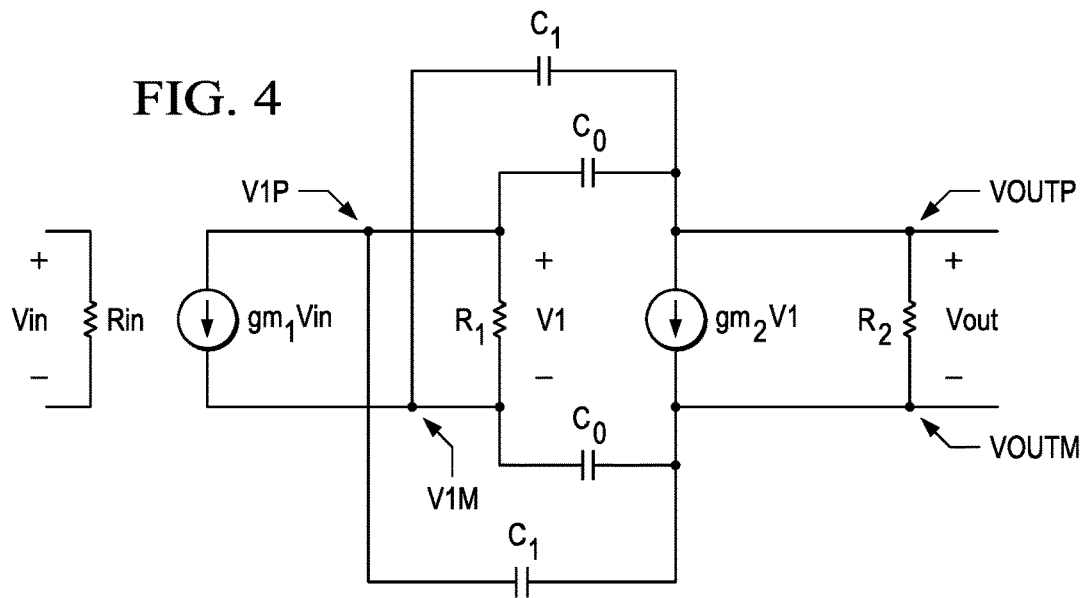
FIG. 4 is an electrical diagram, in schematic form, of a small-signal model for an FDA according to the example embodiment of FIG. 3A.

The analysis of this cross-coupled compensation scheme according to this example embodiment is best described using a small-signal model of FDA 300, as shown in FIG. 4. In this small-signal representation, input voltage Vin corresponds to the differential voltage across inputs INP, INM, and input resistance Rin of FIG. 4 corresponds to the input resistance of the first stage of FDA 300. The input voltage $V_{in}$ is amplified by the first stage of FDA 300 at a transconductance $gm_1$ (as shown in the small signal model of FIG. 4) to drive a differential voltage $V1=gm_1 V_{in}$. Resistance $R_1$ corresponds to the output resistance of this first stage of FDA 300. The second stage of FDA 300 amplifies voltage V1 at a transconductance $gm_2$ to produce output voltage $Vout=gm_2 V1$ across an output resistance $R_2$. The transconductances $gm_1$, $gm_2$ are both negative in this model of FIG. 4, given that each stage of FDA 300 is inverting.

The split compensation capacitors of FDA 300 are illustrated in the small-signal model of FIG. 4 by their nominal capacitances $C_0$ and $C_1$. A capacitance $C_0$ is connected between nodes VOUTP and V1P, and a capacitance $C_0$ is connected between nodes VOUTM and V1M. A cross-coupled capacitance $C_1$ is connected between nodes VOUTP and V1M, and a cross-coupled capacitance $C_1$ is connected between nodes VOUTM and V1P. From this model of FIG. 4, one can derive the small-signal transfer characteristic $$\frac{V_{out}}{V_{in}}$$

of FDA 300 in the Laplace domain through conventional circuit analysis techniques:

$$\frac{V_{out}(s)}{V_{in}(s)} = \frac{gm_1 gm_2 R_1 R_2 \left[1 - \frac{s(C_0 - C_1)}{2gm_2}\right]}{\{1 + sR_1[(1 + gm_2 R_2)C_0 + (1 - gm_2 R_2)C_1]\}\left\{1 + s\frac{2R_2 C_0 C_1}{[gm_2 R_2(C_0 - C_1) + C_0 + C_1]}\right\}} \quad [1]$$

This transfer characteristic exhibits two poles $P_1$ and $P_2$ and one zero $Z_1$ at:

$$P_1 = \frac{1}{2\pi R_1[(1 + gm_2 R_2)C_0 + (1 - gm_2 R_2)C_1]} \quad [2]$$

$$P_2 = \frac{gm_2 R_2(C_0 - C_1) + C_0 + C_1}{4\pi R_2 C_0 C_1} \quad [3]$$

$$Z_1 = \frac{gm_2}{\pi(C_0 - C_1)} \quad [4]$$

In conventional amplifiers, such as FDA 200 of FIG. 2, there is no cross-coupled compensation capacitance $C_1$ between nodes VOUTP and V1M, or between nodes VOUTM and V1P. In other words, capacitance $C_0$ represents the compensation capacitance in conventional amplifiers, while the value of capacitance $C_1$ in conventional FDA 200 of FIG. 2 is zero. In contrast, for FDA 300 of FIG. 3 with the small signal model of FIG. 4, equations [2] through [4] illustrate that the presence of cross-coupled compensation capacitances $C_1$, as represented in the subtraction $(C_0-C_1)$, shifts the poles $P_1$, $P_2$ and the zero $Z_1$ in the transfer characteristic of the FDA 300 from that of the conventional arrangement so as to provide improvement in its bandwidth without sacrificing stability. As evident from equations [2] through [4], cross-coupled capacitance $C_1$ should be smaller than compensation capacitance $C_0$, with the value of the capacitances $C_0$, $C_1$ selected according to the desired gain and transfer characteristic, and the difference between those capacitances selected according to the desired placement of the poles in the transfer characteristic. The range of the capacitance values may vary widely, depending on circuit implementation. For example, it is contemplated that the difference $(C_0 - C_1)$ in capacitance may vary from about 5% to about 95% of the capacitance $C_0$. In some examples, the compensation capacitance $C_0$ may have a value varying from 0.25 pF to 10 pf, for which the cross-coupled capacitance $C_1$ may have a value varying from 0.237 pf to 9.5 pf. The particular capacitance values will, of course, depend on such factors as the operating and threshold voltages of the amplifiers, on the operating frequencies for the amplifiers, on device sizes and characteristics including parasitic capacitances, and on the gains of the amplifier stages.

Referring back to FIG. 3A, cross-coupled compensation capacitors 335, 345 in this example embodiment are thus implemented to each have a capacitance $C_1$ that is smaller than the capacitance $C_0$ of compensation capacitors 330, 340. This cross-coupled compensation has been observed to improve the performance of FDA 300 relative to conventional FDAs such as FDA 200 of FIG. 2, without appreciably degrading common mode stability. If, for example, the sum of the capacitances $C_0$ and $C_1$ of capacitors 330, 335 is approximately the same as the capacitance of the single compensation capacitor 230 in conventional FDA 200 of FIG. 2, the splitting of these capacitances $C_0$ and $C_1$ in FDA 300 of this example implementation amounts to reducing the differential mode compensation (to capacitance $C_0$ only) while maintaining some level of common mode compensation (by capacitance $C_1$). In contrast, decompensation in conventional FDA 200 by reducing the capacitance of compensation capacitor 230 would have the effect of reducing compensation for both the differential mode and the common mode, threatening the common mode stability given the common mode unity gain of the two-stage amplifier.

FIG. 5A illustrates the open loop gain (AOL) and phase margin over frequency for an example of FDA 300 according to this implementation, as compared with an example of conventional FDA 200 constructed as shown in FIG. 2, where both are decompensated for a gain of 12 dB. In this example of FIG. 5A, the sum of capacitances $C_0$ and $C_1$ of capacitors 330, 335 in FDA 300 is about the same as capacitance of the single compensation capacitor 230 in conventional FDA 200. In FIG. 5A, plot 500 represents the open loop gain of conventional FDA 200, while plot 510 represents the open loop gain of FDA 300 according to the example implementation of FIG. 3A. As evident from a comparison of plots 500, 510, the split cross-coupled compensation capacitors 330, 335 in FDA 300 result in an improvement ΔBW in bandwidth at the gain of 12 dB, and thus a significant increase in the gain-bandwidth product. This increase in gain-bandwidth product is obtained without rendering FDA 300 unstable. Plot 520 of FIG. 5A illustrates phase margin over frequency for conventional FDA 200 of FIG. 2, while plot 530 illustrates the phase margin for FDA 300 according to this example embodiment. As evident from FIG. 5A, while plot 530 illustrates that the phase margin of FDA 300 is slightly degraded at the 12 dB gain frequency, relative to that of conventional FDA 200 shown by plot 520, the phase margin at this 12 dB gain frequency is still quite adequate for good stability, at about 75°.

Figure 5B:
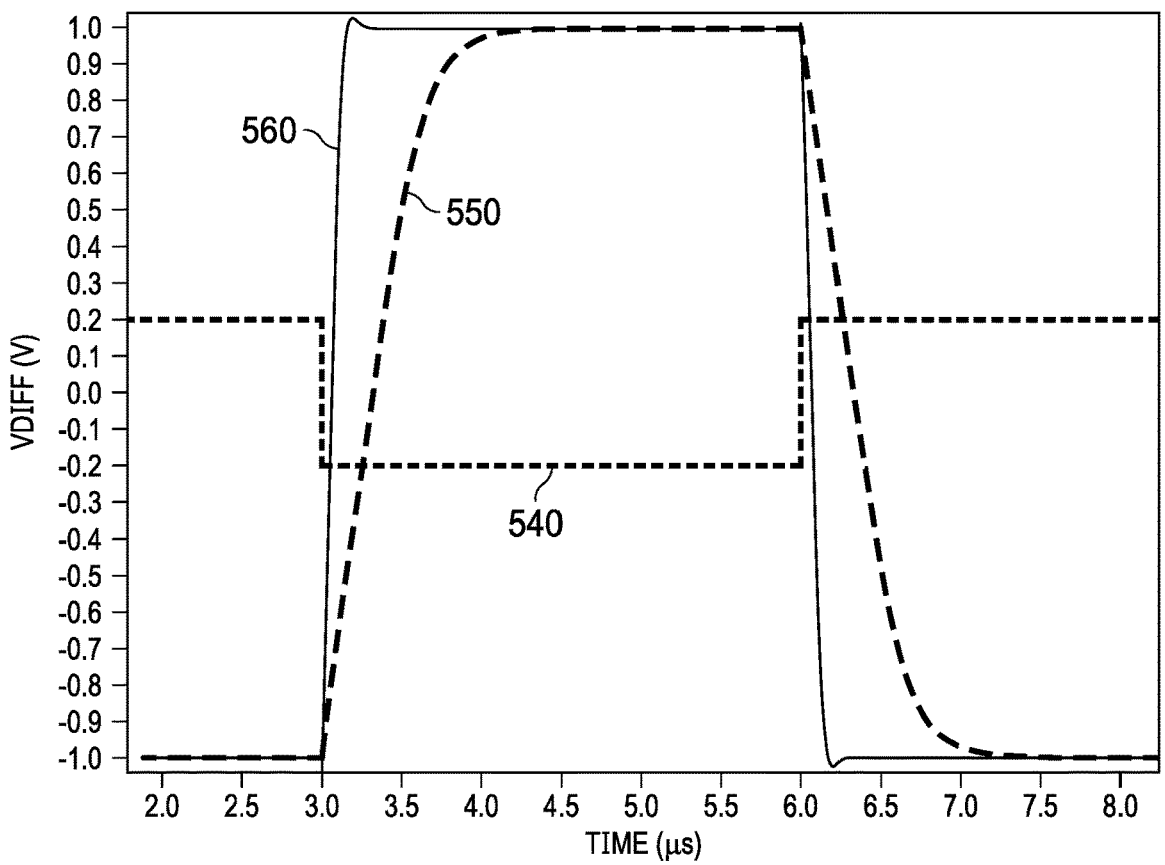
Figure 5C:
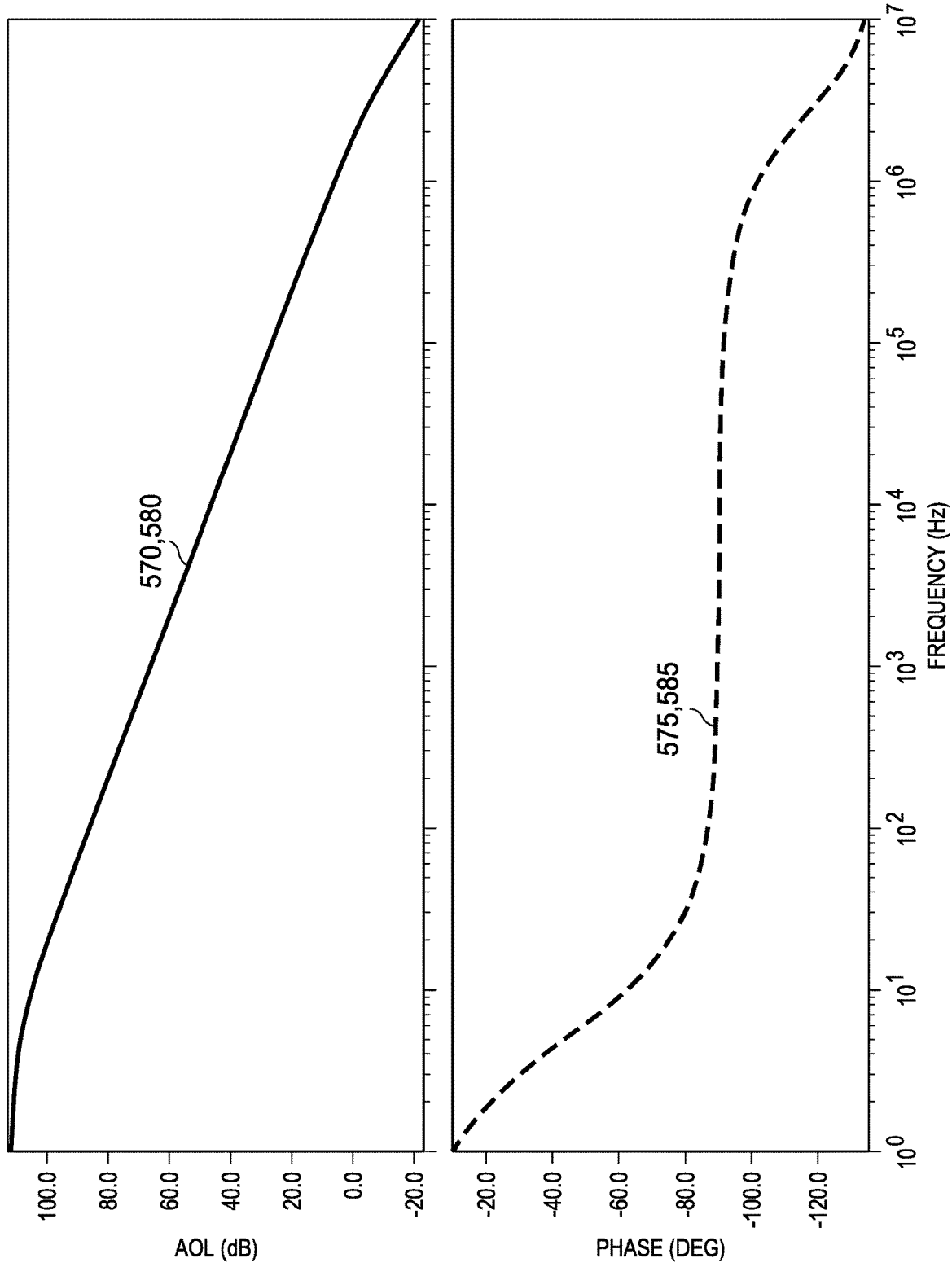

FIG. 5B illustrates an example of improved performance in the response of FDA 300 with split cross-coupled compensation according to this example implementation, as compared with that of conventional FDA 200, again with both decompensated for a gain of 12 dB. Plot 540 of FIG. 5B illustrates transitions of a differential voltage appearing across inputs INP, INM of FDA 200, 300 as the case may be. Plot 550 illustrates the response of conventional FDA 200 of FIG. 2 in response to the transition in plot 540, while plot 560 illustrates the response of FDA 300 at outputs OUTP, OUTM according to the example embodiment of FIG. 3A, again for the example of the sum of capacitances $C_0$ and $C_1$ of each pair of cross-coupled capacitors in FDA 300 being about the same as the capacitance of the single compensation capacitor in conventional FDA 200. The improved gain-bandwidth product of FDA 300 as compared with that of FDA 200 is reflected in the improved responsiveness of plot 560 to the input transition of plot 540, as compared with the response shown by plot 550. This improved performance is provided with little to no change in the common mode performance. FIG. 5C illustrates plots 570, 580 of common mode open loop gain over frequency for conventional FDA 200 and FDA 300 according to this example embodiment, respectively; as evident from these plots 570, 580 overlying one another, there is no distinction in the common mode open loop gain between the two amplifiers. Similarly, plots 575, 585 of FIG. 5C illustrates common mode phase margin for conventional FDA 200 and FDA 300 according to this example embodiment, respectively. Again, these plots 575, 585 overlie one another, indicating no distinction in the common mode phase margin between the two amplifiers.

The plots of FIG. 5A through FIG. 5C clearly illustrate that the split cross-coupled capacitors included in FDA 300 according to this example implementation enable an improvement in gain-bandwidth product, and thus in the response of FDA 300, with good differential mode stability, without adversely affecting the common mode gain or stability of the amplifier.

Figure 3B:
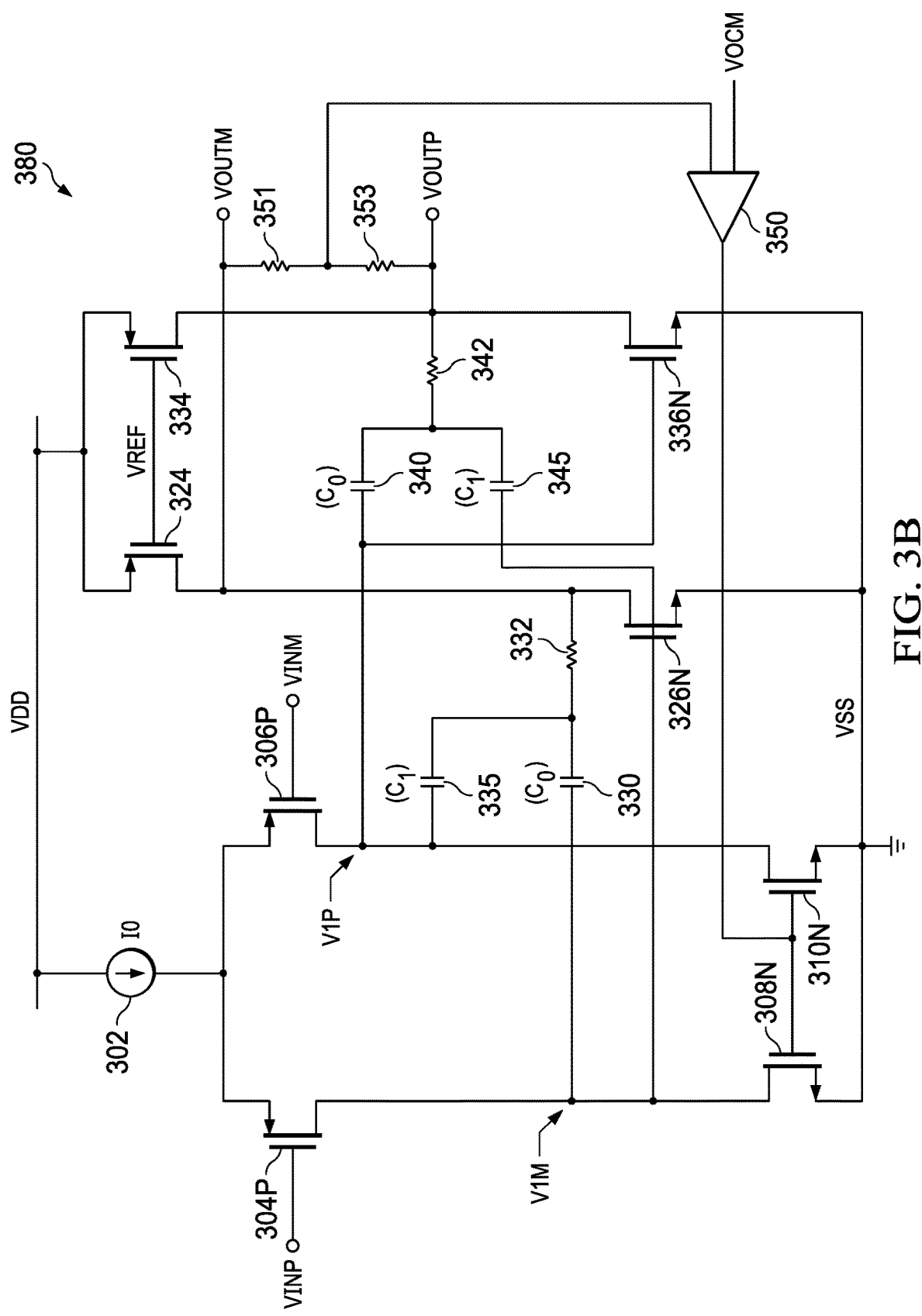
FIG. 3B is an electrical diagram, in schematic form, of an FDA according to another example embodiment.

FIG. 3B illustrates the construction of FDA 380 according to an alternative example implementation. The same reference numbers are used in FIG. 3B relative to FDA 380 to illustrate the same features as in FIG. 3A relative to FDA 300. In one leg of the second stage of FDA 380 according to this example implementation, resistor 332 is connected to output VOUTM and in series with the parallel compensation capacitors 330, 335 between output VOUTM and first stage output node VIM, VIP, respectively. Similarly, in the other leg of the second stage of FDA 380, resistor 342 is connected to output VOUTP in series with the parallel compensation capacitors 340, 345 between output VOUTP and first stage output node VIP, VIM, respectively. In this alternative implementation, additional resistors 332, 342 are provided to insert an additional zero in the frequency response of FDA 380 (relative to that of FDA 300), and thus further improve phase margin. In FDA 380 according to this alternative implementation, therefore, an increase in the gain-bandwidth product and thus a corresponding improvement in performance are enabled, while also providing additional phase margin as a result of series resistors 332, 342 as in this example.

Figure 6A:
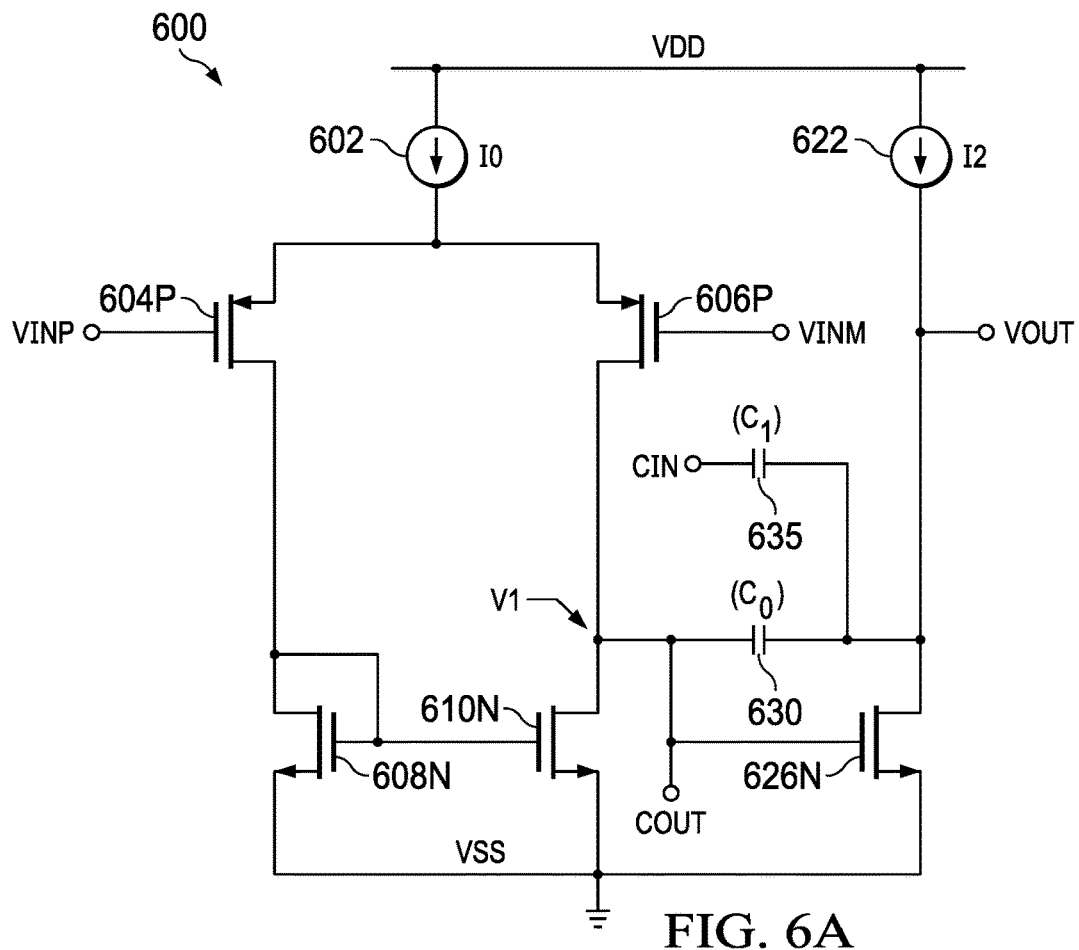
FIG. 6A and FIG. 6B are electrical diagrams, in schematic and block form, respectively, of an INA according to an example embodiment.

Referring now to FIG. 6A, the construction of two-stage differential amplifier 600 with Miller compensation as may be used in an instrumentation amplifier (INA) according to an example implementation. The first stage of amplifier 600 is constructed similarly as that of amplifier 100 described above relative to FIG. 1A, in that current source 602 provides bias current I0 from VDD to the source nodes of parallel PMOS transistors 604P, 606P, which have their gates connected to ground (VSS) through the source/drain paths of NMOS transistors 608N, 610N, respectively. The gates of NMOS transistors 608N and 610N are connected together and to the drain of transistor 608N in current mirror fashion. The gate of PMOS transistor 604P receives non-inverting differential input VINP and the gate of PMOS transistor 606P receives inverting differential input VINM. As in amplifier 100, the voltage at the common drain node of transistors 606P and 610N (at node V1) is an amplified, inverted, voltage corresponding to the differential voltage across inputs VINP and VINM. And as in amplifier 100 described above, the second stage of amplifier 600 includes NMOS transistor 626N with its source/drain path connected in series with current source 622 (conducting bias current I2), and its gate connected to node V1 at the output of the first stage of amplifier 600. The output of amplifier 600 is provided at the drain of NMOS transistor 626N, at node VOUT as shown in FIG. 6A.

Amplifier 600 in this example implementation includes Miller compensation by way of split cross-coupled capacitors 630, 635. As shown in FIG. 6A, compensation capacitor 630 is connected between amplifier output VOUT and first stage output node V1 at the input of the second stage of amplifier 600. Node V1, at which compensation capacitor 630 is connected, is also connected to a terminal COUT. Parallel compensation capacitor 635 is connected between amplifier output VOUT and another terminal CIN. As will be described below, terminal CIN of amplifier 600 will be connected to a terminal COUT of a second amplifier in the INA, and likewise terminal COUT of amplifier 600 will be connected to a terminal CIN of that second amplifier. In this example of amplifier 600, compensation capacitor 630 has a nominal capacitance $C_0$ and cross-coupled compensation capacitor 635 has a nominal capacitance $C_1$ that is smaller than the capacitance $C_0$ of capacitor 630.

Figure 6B:
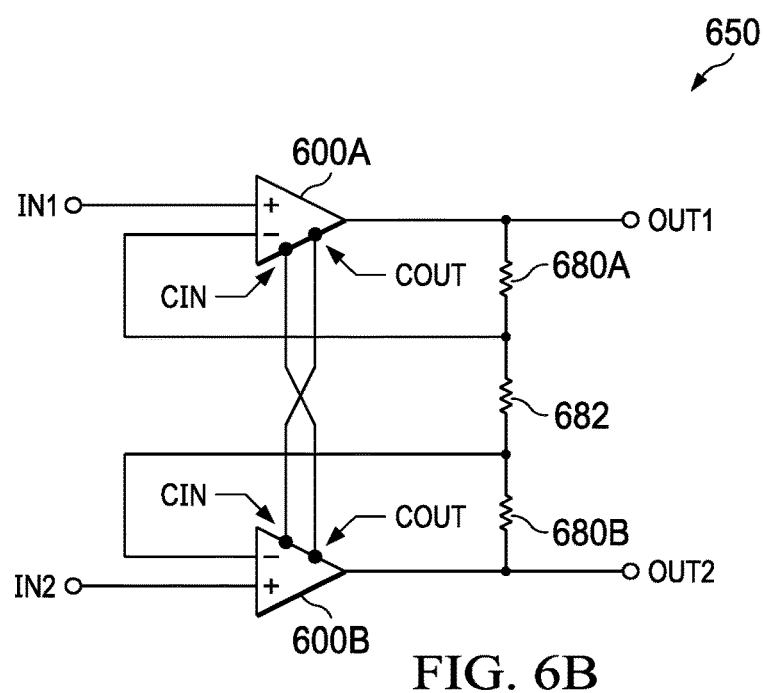

According to this example embodiment, amplifier 600 is implemented as one amplifier in an instrumentation amplifier. FIG. 6B illustrates the arrangement of INA 650 according to this example embodiment. INA 650 includes two amplifiers 600A, 600B, each of which is constructed as amplifier 600 of FIG. 6A. Similarly as in INA 150 described above relative to FIG. 1B, amplifier 600A receives input IN1 at its non-inverting input (VINP) and receives feedback from its output OUT1 via resistor 680A at its inverting input (VINM). Similarly, amplifier 600B receives input IN2 at its non-inverting input (VINP) and receives feedback from its output OUT2 via resistor 680B at its inverting input (VINM). Feedback resistors 680A, 680B are coupled to one another by resistor 682 in series between outputs OUT1, OUT2. In INA 650, however, each of amplifiers 600A, 600B include compensation capacitors 630, 635 coupled to terminals COUT, CIN, respectively as discussed above. Cross-coupling of these compensation capacitors is implemented in INA 650 by the cross-coupled connection of terminal CIN of amplifier 600A to terminal COUT of amplifier 600B, and of terminal COUT of amplifier 600A to terminal CIN of amplifier 600B.

Because of the cross-coupling of terminals CIN, COUT of amplifiers 600A, 600B with one another, capacitor 635 of amplifier 600A is connected between the output terminal VOUT of amplifier 600A itself and the first stage output node V1 of amplifier 600B. Similarly, capacitor 635 of amplifier 600B is connected between terminal VOUT of amplifier 600B itself and the first stage output node V1 of amplifier 600A. As described above, inputs IN1, IN2 of amplifiers 600A, 600B constitute the differential input to INA 650. Accordingly, the cross-coupled connection of capacitor 635 in each of amplifiers 600A, 600B to the first stage output node V1 in the other of amplifiers 600A, 600B maintains common mode compensation in INA 650 while allowing decompensation of INA 650 for differential mode operation via compensation capacitor 630 in each of amplifiers 600A, 600B. INA 650 is thus decompensated with increasing gain for differential mode operation, while maintaining common mode compensation and thus maintaining common mode stability.

Figure 7A:
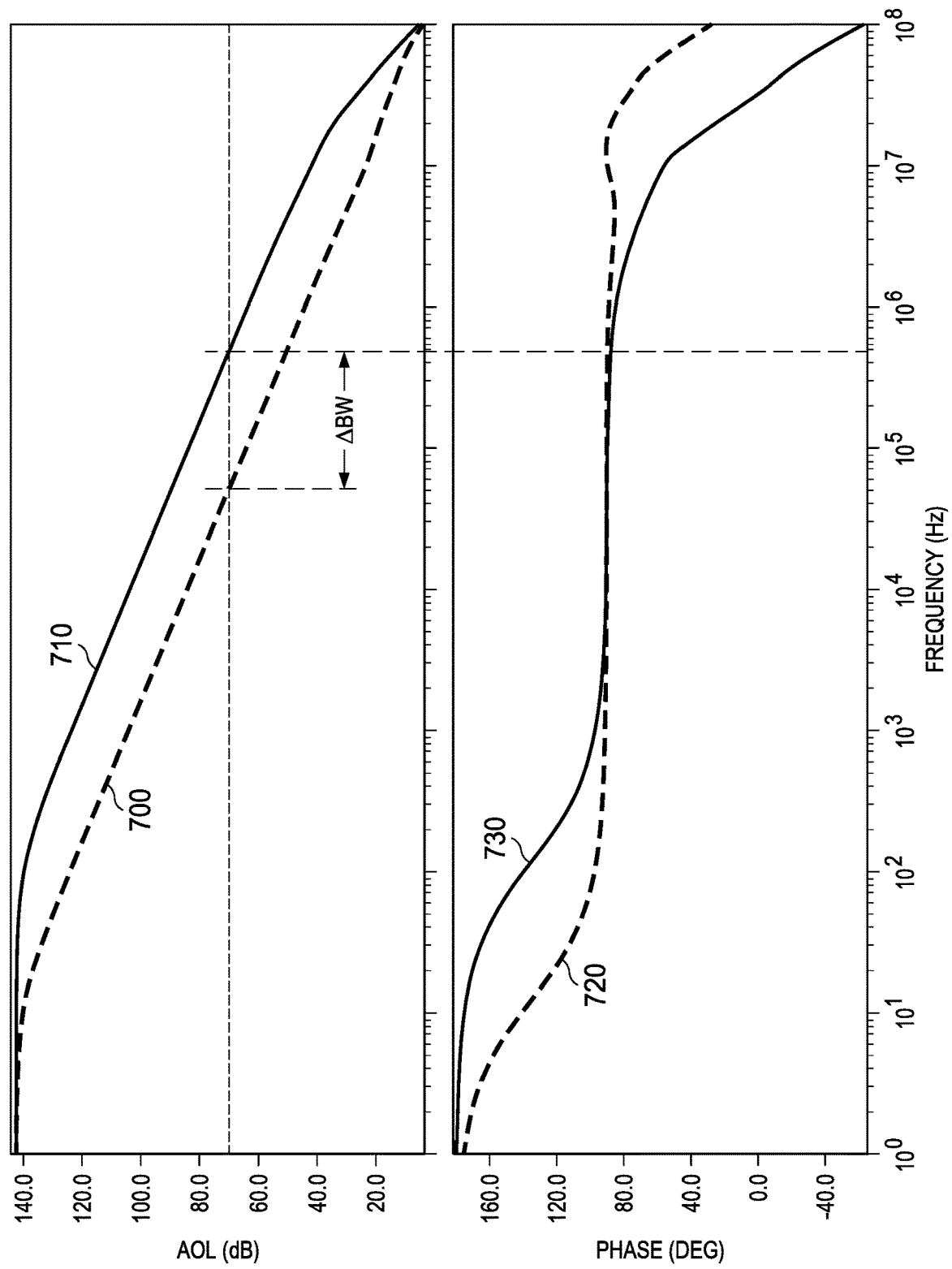
FIG. 7A, FIG. 7B, and FIG. 7C are plots illustrating the performance of an INA according to the example embodiment of FIG. 6A and FIG. 6B in comparison with the performance of a conventional INA.

The improvement in performance of INA 650 enabled by the inclusion of cross-coupled compensation capacitors 635 in amplifiers 600A, 600B is illustrated in FIG. 7A, with reference to the open loop gain (AOL) and phase margin over frequency for an example of INA 650 according to this implementation, as compared with an example of conventional FDA 150 constructed as shown in FIG. 1B. As shown in FIG. 7A for the example of INA 650 with the sum of capacitances $C_0$ and $C_1$ of capacitors 630, 635 is about the same as capacitance of the single compensation capacitor 130 in conventional INA 150. In this example, INA 650 is decompensated for a gain of 69.5 dB. In FIG. 7A, plot 700 represents the open loop gain of conventional INA 150, while plot 710 represents the open loop gain of INA 650 according to the example implementation of FIG. 6A. As evident from a comparison of plots 700 and 710, the split cross-coupled compensation capacitors 330, 335 in amplifiers 600A, 600B of INA 650 result in an improvement ABW in bandwidth at the gain of 69.5 dB, thus exhibiting a significant increase in the gain-bandwidth product. This increase in gain-bandwidth product is obtained without rendering INA 650 unstable. Plot 720 of FIG. 7A illustrates phase margin over frequency for conventional INA 150 of FIG. 1B, while plot 730 illustrates the phase margin for INA 650 according to this example embodiment. As evident from FIG. 7A, the phase margin of INA 650 closely matches that of conventional INA 150 shown by plot 720 at frequencies approaching the gain of 69.5 dB, at an excellent phase margin of close to 90°, and actually exhibits an improvement in phase margin at lower frequencies.

Figure 7B:
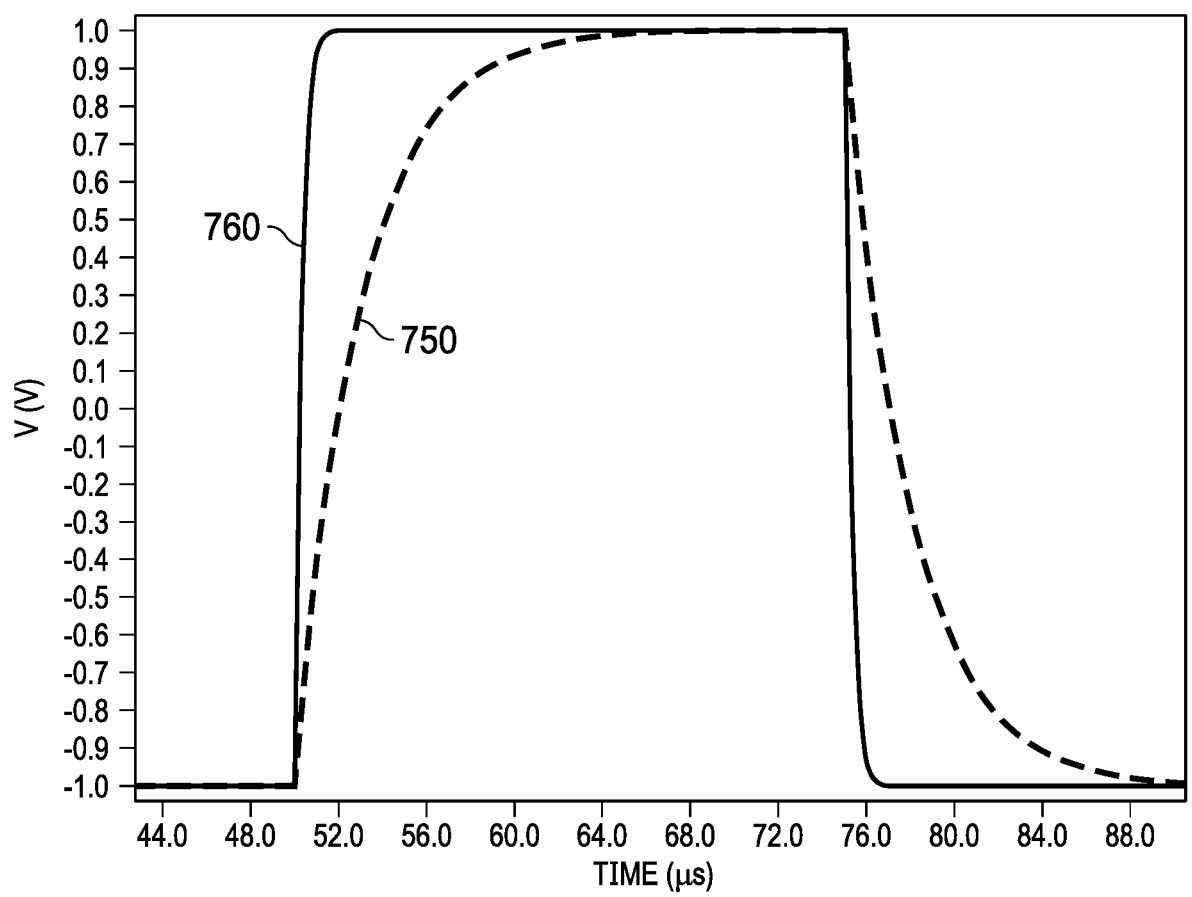
Figure 7C:
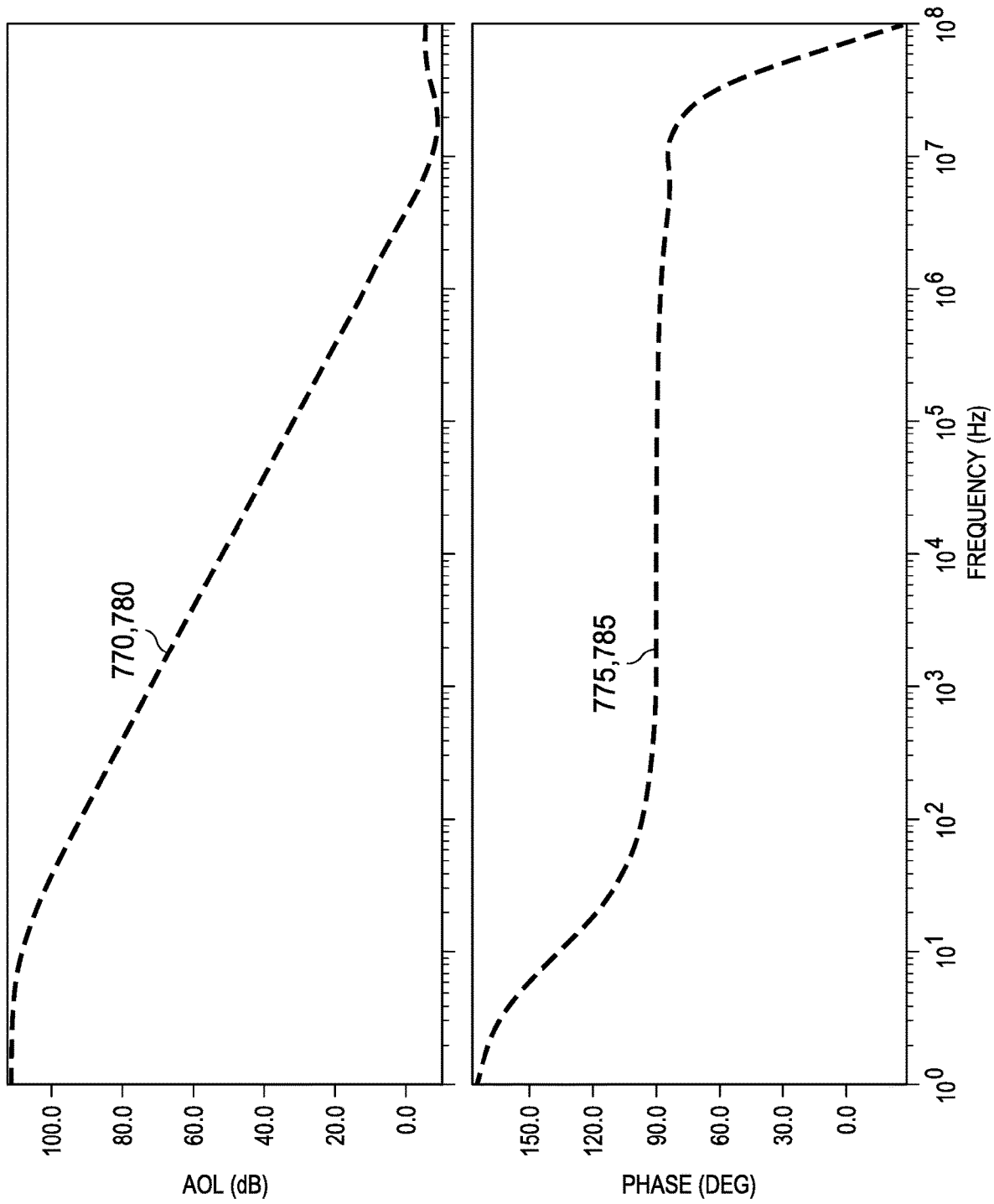

FIG. 7B illustrates an example of improved performance in response of INA 650 with split cross-coupled compensation according to this example implementation, as compared with that of conventional INA 150, with both decompensated for a gain of 69.5 dB. FIG. 7B illustrates the time-domain response of INA 150 and INA 650 in response to a step function transition of a differential voltage appearing across inputs IN1, IN2 (not shown in FIG. 7B). Plot 750 illustrates the response of conventional INA 150 of FIG. 1B in response to this input transition, while plot 760 illustrates the response of INA 650 at outputs OUT1, OUT2. In this example, the sum of capacitances $C_0$ and $C_1$ of capacitors 630, 635 in INA 650 is about the same as capacitance of the single compensation capacitor 630 in conventional INA 150. The improved gain-bandwidth product of INA 650 as compared with that of INA 150 is reflected in the improved responsiveness shown by plot 760 as compared with the response shown by plot 750. This improved performance is provided with little to no change in the common mode performance. FIG. 7C illustrates plot 770, 780 of common mode open loop gain over frequency for INA 650 according to this example embodiment and conventional INA 150, respectively. As evident from plots 770, 780 overlying one another, there is no distinction in the common mode open loop gain between the two amplifiers. Similarly, plot 775, 785 of FIG. 7C illustrates common mode phase margin for conventional INA 150 and INA 650 according to this example embodiment, respectively. Again, as evident from plots 775, 785 overlying one another, there is no distinction in the common mode phase margin between the two amplifiers.

The plots of FIG. 7A through FIG. 7C clearly illustrate that the split cross-coupled capacitors included in INA 650 according to this example implementation enable an improvement in gain-bandwidth product, and thus in the response of INA 650, with good stability, while in fact improving the common mode stability of the amplifier.

Figure 6C:
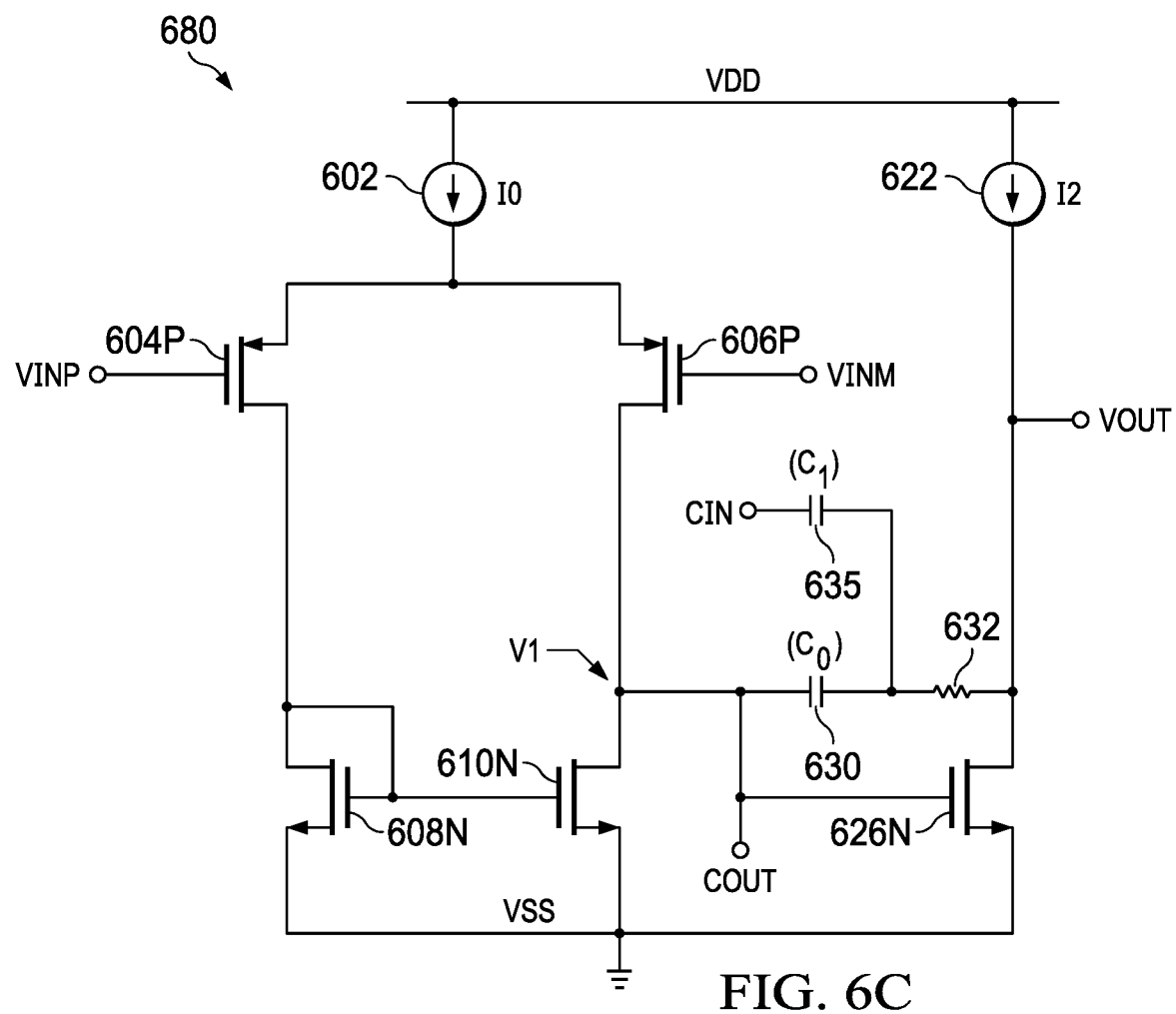
FIG. 6C is an electrical diagram, in schematic form, of a stage of an INA according to another example embodiment.

FIG. 6C illustrates the construction of amplifier 680 according to an alternative example implementation. The same reference numbers are used in FIG. 6C relative to amplifier 680 to illustrate the same features as in FIG. 6A relative to amplifier 600. In the second stage of amplifier 680 according to this example implementation, resistor 632 is connected to output VOUT and in series with the parallel compensation capacitors 630, 635 between output VOUT and first stage output node V1 and terminal CIN, respectively. In this alternative implementation, additional resistor 632 is provided to insert an additional zero in the frequency response of amplifier 680 (relative to that of amplifier 600), and thus further improve phase margin. In amplifier 680 according to this alternative implementation, therefore, an increase in the gain-bandwidth product and thus a corresponding improvement in performance are enabled, while also providing additional phase margin as a result of series resistor 632 as in this example. With respect to INA 650 of FIG. 6B, amplifiers 600A and/or 600B are implemented using amplifier 600 and/or amplifier 680 in some example embodiments.

Figures 8A, 8B:
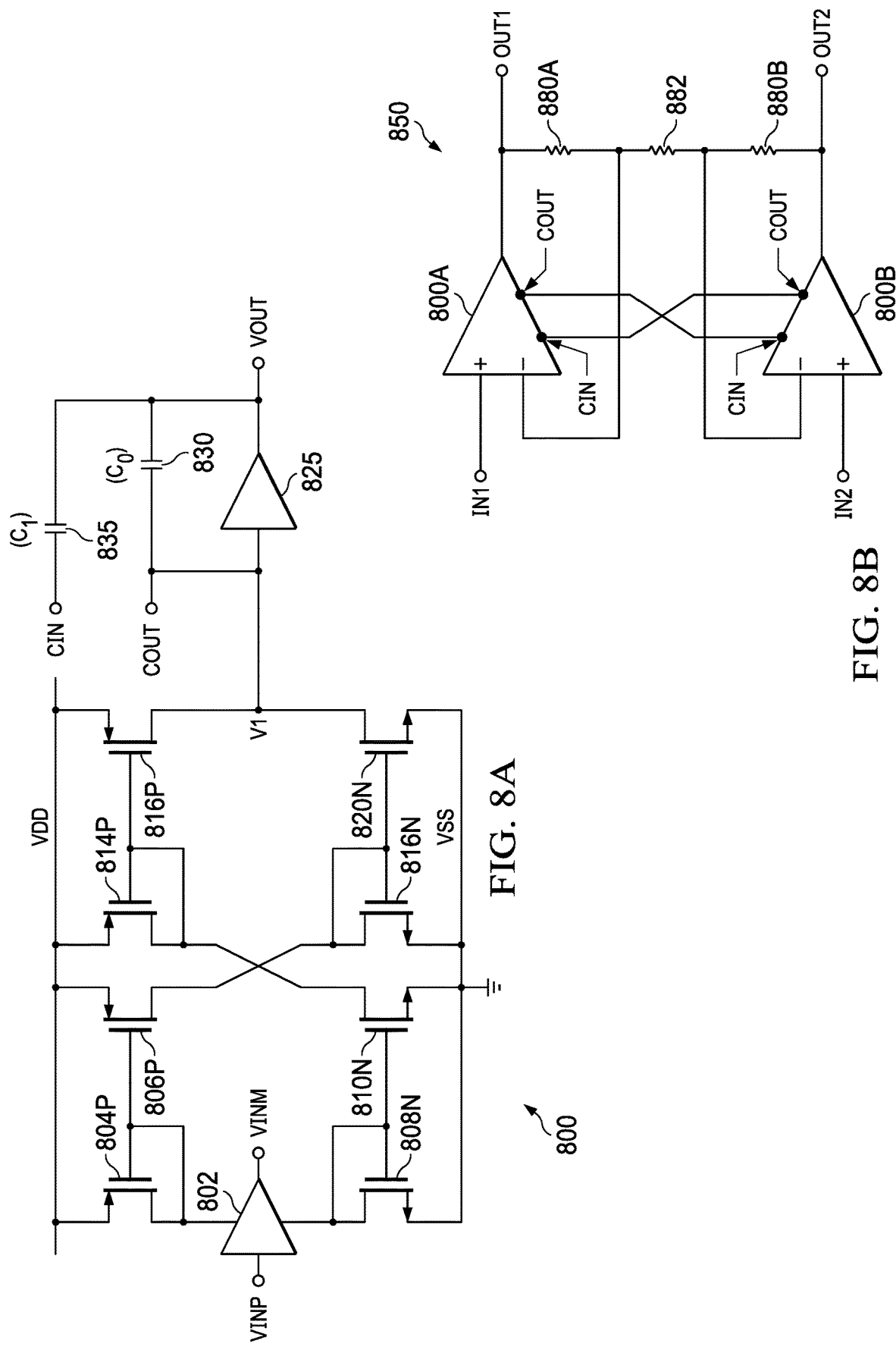
FIG. 8A and FIG. 8B are electrical diagrams, in schematic and block form, respectively, of an INA according to another example embodiment.

FIG. 8A illustrates the construction of two-stage differential amplifier 800 with Miller compensation as may be used in an instrumentation amplifier (INA) according to another example implementation. More specifically, while differential amplifier 600 described above in connection with FIG. 6A is a voltage feedback amplifier (VFA), amplifier 800 of FIG. 8A is of the current feedback amplifier (CFA) type. In this example, a first stage of amplifier 800 includes unity gain noninverting buffer 802 with an input receiving non-inverting (positive) differential input VINP, and an output receiving inverting (negative) differential input VINM. Buffer 802 is biased in a first leg of a current mirror. A positive bias input of buffer 802 is coupled to the drain and gate of PMOS transistor 804P, which has its source at VDD, and a negative bias input of buffer 802 is coupled to the drain and gate of NMOS transistor 808N, which has its source connected to VSS (e.g., ground). PMOS transistor 806P has its source at VDD, and its gate connected to the gate and drain of PMOS transistor 804P; similarly, NMOS transistor 810N has its gate connected to the gate and drain of NMOS transistor 808N, and its source connected to VSS (e.g., ground). Transistors 806P, 810N are each cross-coupled into a second current mirror. Specifically, the drain of PMOS transistor 806P is connected to the gate and drain of NMOS transistor 8016N, which has its source at ground, and the drain of transistor 810N is connected to the gate and drain of PMOS transistor 814P. In this second current mirror, PMOS transistor 816P has its source at VDD, its drain at intermediate node V1, and its gate connected to the gate and drain of PMOS transistor 814P. NMOS transistor 820N has its drain connected to intermediate node V1, its gate at the gate and drain of NMOS transistor 816N, and its source at ground.

In the second stage of amplifier 800, inverting amplifier 825 has its input connected to intermediate node V1, and drives amplifier output VOUT at its output. In operation, a differential voltage between inputs INP, INM is reflected in an imbalance current in the first stage of amplifier 800. By operation of the cross-coupled current mirrors, this imbalance current is reflected in the voltage at intermediate node V1, which is amplified by inverting amplifier 825 to produce the output voltage at amplifier output VOUT.

Amplifier 800 in this example implementation includes Miller compensation by way of split cross-coupled capacitors 830, 835. As shown in FIG. 8A, compensation capacitor 830 is connected between amplifier output VOUT and first stage output node V1 at the input of the second stage of amplifier 800. Miller compensation capacitor 830 is coupled between amplifier output VOUT and intermediate node V1. As in amplifier 600 described above, intermediate node V1 is also connected to a terminal COUT. Parallel compensation capacitor 835 is connected between amplifier output VOUT and another terminal CIN. As will be described below, terminal CIN of amplifier 800 will be connected to a terminal COUT of a second amplifier in the INA, and likewise terminal COUT of amplifier 800 will be connected to a terminal CIN of that second amplifier. As in the case of amplifier 600, compensation capacitor 830 has a nominal capacitance $C_0$ and cross-coupled compensation capacitor 835 has a nominal capacitance $C_1$ that is smaller than the capacitance $C_0$ of capacitor 830.

According to this example embodiment, amplifier 800 is implemented as one amplifier in an instrumentation amplifier. FIG. 8B illustrates the arrangement of INA 850 according to this example embodiment. INA 850 includes two amplifiers 800A, 800B, each of which is constructed as amplifier 800 of FIG. 8A. As described above in connection with INA 650 of FIG. 6B, amplifier 800A receives input IN1 at its non-inverting input (VINP) and receives feedback from its output OUT1 via resistor 880A at its inverting input (VINM). Similarly, amplifier 800B receives input IN2 at its non-inverting input (VINP) and receives feedback from its output OUT2 via resistor 880B at its inverting input (VINM). Feedback resistors 880A, 880B are coupled to one another by resistor 682 in series between outputs OUT1, OUT2. In this arrangement of INA 850, because each of amplifiers 800A, 800B include compensation capacitors 830, 835 coupled to terminals COUT, CIN, respectively, are cross-coupled by the connection of terminal CIN of amplifier 800A to terminal COUT of amplifier 800B, and of terminal COUT of amplifier 800A to terminal CIN of amplifier 800B.

As described above, this cross-coupling of terminals CIN, COUT of amplifiers 800A, 800B with one another connects capacitor 835 of amplifier 800A is connected between the output terminal VOUT of amplifier 800A itself and the first stage output node V1 of amplifier 600B. Similarly, capacitor 835 of amplifier 800B is connected between terminal VOUT of amplifier 800B itself and the first stage output node V1 of amplifier 800A. As a result of this cross-coupled connection of capacitor 835 in each of amplifiers 800A, 800B to the first stage output node V1 in the other of amplifiers 800A, 800B common mode compensation is maintained in INA 850 of the current feedback amplifier (CFA) type, while allowing decompensation of INA 850 for differential mode operation via compensation capacitor 630 in each of amplifiers 800A, 800B. INA 850 is thus decompensated with increasing gain for differential mode operation, while maintaining common mode compensation and thus maintaining common mode stability. This cross-coupling can provide improvement in gain-bandwidth product, and thus in the response of INA 850, with good stability, while in fact improving the common mode stability of the amplifier.

In this alternative implementation of FIG. 6A and FIG. 6B in which CFA-type amplifiers utilize cross-coupled compensation capacitors, an additional resistor may be connected between amplifier output VOUT and the two parallel compensation capacitors 830, 835 to insert an additional zero in the frequency response of amplifier 800 and thus further improve phase margin, as described above.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

Unless otherwise stated, "about," "approximately," or "substantially" preceding a value means +/−10 percent of the stated value. Modifications are possible in the described examples, and other examples are possible within the scope of the claims.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. A differential amplifier, comprising:
    first amplifier circuitry, having a pair of inputs for receiving a differential input voltage, and having first and second intermediate outputs; and
    second amplifier circuitry, comprising:
        a first amplifier having an input coupled to the first intermediate output of the first amplifier circuitry, and having an output;
        a second amplifier having an input coupled to the second intermediate output of the first amplifier circuitry, and having an output;
    a first compensation capacitor coupled between the output of the first amplifier leg and the input of the first amplifier leg;
    a second compensation capacitor coupled between the output of the second amplifier leg and the input of the second amplifier leg;
    a first cross-coupled capacitor coupled between the output of the first amplifier leg and the input of the second amplifier leg; and
    a second cross-coupled capacitor coupled between the output of the second amplifier leg and the input of the first amplifier leg;
    wherein the first cross-coupled capacitor has a capacitance smaller than a capacitance of the first compensation capacitor;
    and wherein the second cross-coupled capacitor has a capacitance smaller than a capacitance of the second compensation capacitor.

2. The amplifier of claim 1, wherein the first amplifier circuitry comprises:
    a first current source;
    a first input transistor having a conduction path coupled to the first current source, and having a control terminal coupled to a first differential input of the pair of inputs;
    a first bias transistor having a conduction path connected to the conduction path of the first input transistor at the second intermediate output, and having a control terminal receiving a bias level;
    a second input transistor having a conduction path coupled to the first current source, and having a control terminal coupled to a second differential input of the pair of inputs; and
    a second bias transistor having a conduction path connected to the conduction path of the second input transistor at the first intermediate output, and having a control terminal receiving the bias level.

3. The amplifier of claim 2, wherein the first amplifier of the second amplifier circuitry comprises:
    a third bias transistor having a conduction path coupled to a power supply voltage, and having a control terminal receiving a bias level;
    a third amplifier transistor having a conduction path connected in series with the conduction path of the third bias transistor at the output of the first amplifier, and having a control terminal coupled to the first intermediate output;
    and wherein the second amplifier leg of the second stage comprises:
        a fourth bias transistor having a conduction path coupled to a power supply voltage, and having a control terminal receiving a bias level;
        a fourth amplifier transistor having a conduction path connected in series with the conduction path of the fourth bias transistor at the output of the second amplifier leg, and having a control terminal coupled to the second intermediate output.

4. The amplifier of claim 1, wherein the first amplifier circuitry comprises:
    a first input stage constructed to produce a voltage at a first intermediate output corresponding to a differential voltage across first and second inputs; and
    a second input stage constructed to produce a voltage at a second intermediate output corresponding to a differential voltage across third and fourth inputs.

5. The amplifier of claim 4, wherein the first input stage comprises:
    a first current source;
    a first current mirror having first and second current mirror transistors;
    a first input transistor having a conduction path coupled between the current source and the first current mirror transistor, and having a control terminal coupled to a first differential input; and
    a second input transistor having a conduction path coupled between the current source and the second current mirror transistor, and having a control terminal coupled to a first feedback input, the first intermediate output at a node between the conduction path of the second input transistor and the second current mirror transistor; and
    and wherein the second input stage comprises:
        a second current source;
        a second current mirror having third and fourth current mirror transistors;
        a third input transistor having a conduction path coupled between the second current source and the third current mirror transistor, and having a control terminal coupled to a second differential input; and
        a fourth input transistor having a conduction path coupled between the second current source and the fourth current mirror transistor, and having a control terminal coupled to a second feedback input, the second intermediate output at a node between the conduction path of the fourth input transistor and the fourth current mirror transistor.

6. The amplifier of claim 5, wherein the first amplifier of the second amplifier circuitry comprises:
    a third current source; and
    a third amplifier transistor having a conduction path coupled to the third current source at a first amplifier output, and having a control terminal coupled to the first intermediate output;

and wherein the second amplifier of the second amplifier circuitry comprises:
   a fourth current source; and
   a fourth amplifier transistor having a conduction path coupled to the fourth current source at a second amplifier output, and having a control terminal coupled to the second intermediate output.

7. The amplifier of claim 6, further comprising:
a feedback network coupled between the first amplifier output and the second amplifier output, and coupled to the first and second feedback inputs of the first and second differential amplifiers.

8. The amplifier of claim 4, wherein the first input stage comprises:
   a first buffer, having an input coupled to a first differential input and an output coupled to a first feedback input; and
   first and second cross-coupled current mirrors, wherein the buffer is coupled in a first leg of the first current mirror, and a first intermediate output is at a node in a second leg of the second cross-coupled current mirror;
   wherein the first amplifier of the second amplifier circuitry comprises:
      a first inverting amplifier having an input coupled to the first intermediate output and an output coupled to a first amplifier output;
   wherein the second input stage comprises:
      a second buffer, having an input coupled to a second differential input and an output coupled to a second feedback input; and
      third and fourth cross-coupled current mirrors, wherein the buffer is coupled in a first leg of the third current mirror, and a second intermediate output is at a node in a second leg of the fourth cross-coupled current mirror;
   and wherein the second amplifier of the second amplifier circuitry comprises:
      a second inverting amplifier having an input coupled to the second intermediate output and an output coupled to a first amplifier output.

9. The amplifier of claim 8, further comprising:
a feedback network coupled between the first amplifier output and the second amplifier output, and coupled to the first and second feedback inputs of the first and second differential amplifiers.

10. The amplifier of claim 1, further comprising:
a first resistor coupled on one side to the output of the first amplifier leg and coupled on another side to the first compensation capacitor and the first cross-coupled capacitor; and
a second resistor coupled on one side to the output of the second amplifier leg and coupled on another side to the second compensation capacitor and the second cross-coupled capacitor.

11. A differential amplifier, comprising:
a first amplifier stage, comprising:
   a current source;
   a first input transistor having a conduction path coupled to the current source, and having a control terminal coupled to a first differential input;
   a first bias transistor having a conduction path connected to the conduction path of the first input transistor at a first intermediate output, and having a control terminal;
   a second input transistor having a conduction path coupled to the current source, and having a control terminal coupled to a second differential input; and
   a second bias transistor having a conduction path connected to the conduction path of the second input transistor at a second intermediate output, and having a control terminal coupled to the control terminal of the first bias transistor; and
a second amplifier stage, comprising:
   a third bias transistor having a conduction path coupled to a power supply voltage, and having a control terminal;
   a third amplifier transistor having a conduction path connected in series with the conduction path of the third bias transistor at a first amplifier output, and having a control terminal coupled to the first intermediate output;
   a first compensation capacitor coupled between the first amplifier output and the first intermediate output;
   a fourth bias transistor having a conduction path coupled to the power supply voltage, and having a control terminal coupled to the control terminal of the third bias transistor; and
   a fourth amplifier transistor having a conduction path connected in series with the conduction path of the fourth bias transistor at a second amplifier output, and having a control terminal coupled to the second intermediate output;
   a second compensation capacitor coupled between the second amplifier output and the second intermediate output;
   a first cross-coupled capacitor coupled between the first amplifier output and the second intermediate output; and
   a second cross-coupled capacitor coupled between the second amplifier output and the first intermediate output;
   wherein the first cross-coupled capacitor has a capacitance smaller than a capacitance of the first compensation capacitor; and
   wherein the second cross-coupled capacitor has a capacitance smaller than a capacitance of the second compensation capacitor.

12. The differential amplifier of claim 11, further comprising:
a first resistor coupled on one side to the first amplifier output leg and coupled on another side to the first compensation capacitor and the first cross-coupled capacitor; and
a second resistor coupled on one side to the second amplifier output and coupled on another side to the second compensation capacitor and the second cross-coupled capacitor.

13. An instrumentation amplifier, comprising:
a first differential amplifier, comprising:
   a first input stage configured to produce a voltage at a first intermediate output corresponding to a differential voltage across a first input and a second input;
   a first amplifier having an input coupled to the first intermediate output, and an output coupled to a first amplifier output;
   a first compensation capacitor coupled between the first amplifier output and the first intermediate output;
   a first terminal of the first differential amplifier connected to the first intermediate output; and a first cross-coupled capacitor coupled between the first amplifier output and a second terminal of the first differential amplifier; and a second differential amplifier, comprising:

a second input stage configured to produce a voltage at a second intermediate output corresponding to a differential voltage across a third input and a fourth input;

a second amplifier having an input coupled to the second intermediate output, and an output coupled to a second amplifier output;

a second compensation capacitor coupled between the second amplifier output and the second intermediate output;

a first terminal of the second differential amplifier coupled to the second intermediate output; and a second cross-coupled capacitor coupled between the second amplifier output and a second terminal of the second differential amplifier;

wherein the first terminal of the first differential amplifier is coupled to the second terminal of the second differential amplifier;

and wherein the first terminal of the second differential amplifier is coupled to the second terminal of the first differential amplifier.

14. The instrumentation amplifier of claim 13, wherein the first amplifier comprises:

a first amplifier transistor having a control terminal coupled to the first intermediate output, and a conduction path coupled to a first amplifier output;

and wherein the second amplifier comprises:

a second amplifier transistor having a control terminal coupled to the second intermediate output, and a conduction path coupled to a second amplifier output.

15. The instrumentation amplifier of claim 14, further comprising:

a feedback network coupled between the first amplifier output and the second amplifier output, and coupled to the second input of the first differential amplifier and to the fourth input of the second differential amplifier.

16. The instrumentation amplifier of claim 14, wherein the first cross-coupled capacitor has a capacitance smaller than a capacitance of the first compensation capacitor;

and wherein the second cross-coupled capacitor has a capacitance smaller than a capacitance of the second compensation capacitor.

17. The instrumentation amplifier of claim 16, wherein the first differential amplifier further comprises a first resistor coupled on one side to the first amplifier output and coupled on another side to the first compensation capacitor and the first cross-coupled capacitor;

and wherein the second differential amplifier further comprises a second resistor coupled on one side to the second amplifier output and coupled on another side to the second compensation capacitor and the second cross-coupled capacitor.

18. The instrumentation amplifier of claim 14, wherein the first input stage comprises:

a first current source;

a first current mirror having first and second current mirror transistors;

a first input transistor having a conduction path coupled between the current source and the first current mirror transistor, and having a control terminal coupled to a first differential input; and a second input transistor having a conduction path coupled between the current source and the second current mirror transistor, and having a control terminal coupled to a first feedback input, the first intermediate output at a node between the conduction path of the second input transistor and the second current mirror transistor; and and wherein the second input stage comprises:

a second current source;

a second current mirror having third and fourth current mirror transistors;

a third input transistor having a conduction path coupled between the second current source and the third current mirror transistor, and having a control terminal coupled to a second differential input; and a fourth input transistor having a conduction path coupled between the second current source and the fourth current mirror transistor, and having a control terminal coupled to a second feedback input, the second intermediate output at a node between the conduction path of the fourth input transistor and the fourth current mirror transistor.

* * * * *